(12) United States Patent
Nakagawa

(10) Patent No.: US 6,462,607 B1
(45) Date of Patent: Oct. 8, 2002

(54) RAMP LOADING CIRCUIT FOR REDUCING CURRENT SURGES

(75) Inventor: Osamu Samuel Nakagawa, Redwood City, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/995,640

(22) Filed: Nov. 29, 2001

(51) Int. Cl.⁷ .................................................. G05F 1/00
(52) U.S. Cl. ........................................ 327/519; 327/310
(58) Field of Search ................................. 327/131, 310, 327/317, 322, 879, 403, 519, 520, 530, 538, 544; 323/315; 365/206, 204; 361/31, 93.9

(56) References Cited

U.S. PATENT DOCUMENTS

| | | | |
|---|---|---|---|
| 3,935,511 A | 1/1976 | Boulanger et al. | |
| 5,079,455 A | 1/1992 | McCafferty et al. | |
| 5,726,849 A | 3/1998 | Nakamura | |
| 5,999,387 A | * 12/1999 | Roesch et al. | 361/58 |
| 6,232,675 B1 | * 5/2001 | Small | 307/30 |
| 6,246,555 B1 | * 6/2001 | Tham | 323/274 |

* cited by examiner

*Primary Examiner*—My-Trang Nu Ton

(57) ABSTRACT

A ramp loading circuit for slowing current change in a circuit block. The circuit may include a plurality of load circuits placed in parallel with the circuit block and a control circuit. Each load circuit may provide a path for current flow when the load circuit is activated. Each load circuit may also be configured to allow a gradual decrease in current flow through the path when the load circuit is deactivated. The control circuit may be configured to deactivate each load circuit before the circuit block enters the sleep mode.

21 Claims, 4 Drawing Sheets

RAMP LOADING CIRCUIT FOR REDUCING CURRENT SURGES

RELATED APPLICATIONS

This application is related to a concurrently filed application entitled "Method For Reducing Current Surge Using Multi-Stage Ramp Shunting", the subject matter of which is incorporated herein in its entirety.

FIELD OF THE INVENTION

This invention relates generally to suppression of noise, and more particularly to suppression of noise resulting from current surges in an integrated circuit.

BACKGROUND OF THE INVENTION

Current surges in circuits comprising electronic components are well known. A current surge is a sudden, almost instantaneous, change (usually an increase) in the current that is flowing through a circuit or a component. In an integrated circuit, such a surge may result from a circuit block within the integrated circuit waking up from a sleep mode, for example. A current surge or large change in current is illustrated in FIG. 1.

In FIG. 1, the current I is, initially, at a low value $I_L$ while a circuit block is in a sleep mode. This mode may result from inactivity or low activity of the circuit block for a predetermined amount of time or until a certain event occurs. Upon expiration of the predetermined amount of time or the occurrence of a triggering event, such as the activation of the circuit block (i.e., no longer in a sleep mode) at time $t_H$ for example; a current surge takes place. The surge may be caused by many factors such as an increase in impedance in another part of the integrated circuit relative to the impedance in the circuit block for example. Since the circuit block is no longer in the sleep mode, it may be considered to be in a wake-up mode. At time $t_H$, therefore, the value of the current $I_L$ increases drastically to a much higher value $I_H$ almost instantly. The current in the circuit block may remain at this value (i.e., $I_H$) until another sleep mode at time $t_L$ decreases the current to $I_L$. In addition to subjecting circuit components to stresses, a large change in the current results in undesirable noise. Among other things, noise causes power and ground bounce that reduces the driving capability of a transistor leading to timing errors.

Other approaches for suppression of current surge include U.S. Pat. No. 5,726,849 (issued to Nakamura) for example. In Nakamura, a resistor element in parallel with a switching element is connected in series with an input circuit to break the circuit in response to an overcurrent or over heating. Another approach is the method of U.S. Pat. No. 5,079,455 (issued to McCafferty et al.), which discloses a current limiting circuit. Yet another approach is disclosed in U.S. Pat. No. 3,935,511 (issued to Boulanger et al.). According to Boulanger, a resistive device is provided in series with a load at initial turn-on, the device being shunted once the current inrush has passed.

Each of these patents involve the placement of a protective circuit (or circuit element) in series with another circuit (or circuit element) that is being protected from a current surge. The protection of circuit elements from current surge is needed in these patents as the elements cannot tolerate the current surge. Current surge subjects unprotected circuit elements to conditions that the elements are not designed for. As a result, the elements malfunction or more likely, the elements are destroyed.

SUMMARY OF THE INVENTION

A ramp loading circuit for slowing current change in a circuit block is described. The circuit may include a plurality of load circuits placed in parallel with the circuit block and a control circuit. Each load circuit may provide a path for current flow when the load circuit is activated. Each load circuit may also be configured to allow a gradual decrease in current flow through the path when the load circuit is deactivated. The control circuit may be configured to deactivate each load circuit before the circuit block enters the sleep mode.

BRIEF DESCRIPTION OF THE DRAWINGS

The invention is illustrated by way of example and not limitation in the accompanying figures in which like numeral references refer to like elements, and wherein.

DETAILED DESCRIPTION OF THE INVENTION

In the following detailed description, numerous specific details are set forth in order to provide a thorough understanding of the invention. However, it will be apparent to one of ordinary skill in the art that these specific details need not be used to practice the invention. In other instances, well known structures, interfaces, and processes have not been shown in detail in order not to obscure unnecessarily the invention.

Figure 2:
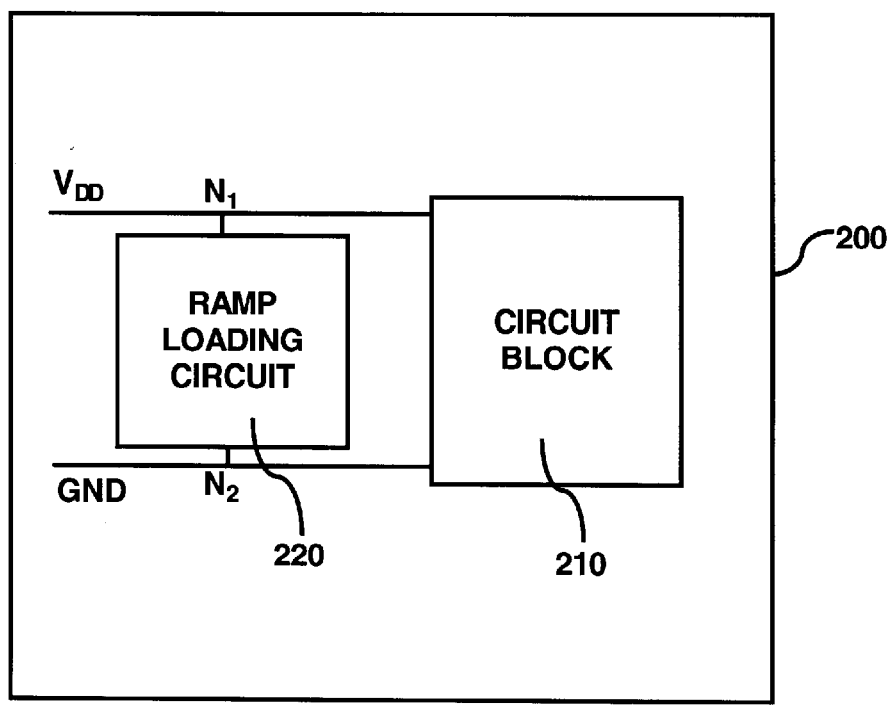
FIG. 2 illustrates an exemplary integrated circuit having a ramp loading circuit according to an embodiment of the invention.

FIG. 2 is a block diagram illustrating an integrated circuit 200. Although one embodiment involves an integrated circuit, the invention is not so limited; the circuit 200 may be any circuit. The circuit 200 includes a circuit block 210 that is subject to noise resulting from current surges. The circuit 200 may include at least two nodes, a first node $N_1$ and a second node $N_2$. The circuit block 210 may be coupled between the first node $N_1$ and second node $N_2$.

The circuit 200 also includes a ramp loading circuit 220, in parallel with the circuit block 210, for eliminating the noise from a current surge according to an exemplary embodiment of the invention. The ramp loading circuit is placed between a voltage source ($V_{DD}$) and ground (GND). Unlike other circuits that are protected from current surges, the circuit block 210 is designed to tolerate the current surge without disabling or destroying components of the circuit block 210.

A circuit, such as the circuit block 210, may experience a current surge under a plurality of conditions. As one example of such a condition, a circuit block may enter a sleep mode which is well known. In such a mode, the circuit block operates in a less than a fully active state. Sleep mode is typically a standby mode as well. A circuit (or circuit block such as 210) may be activated from a sleep mode upon the occurrence of an event, including time lapse. At this point, the circuit enters an active state. This transition often leads to a current surge and the corresponding noise. The invention overcomes the noise by utilizing the ramp loading circuit 220.

Figure 3A:
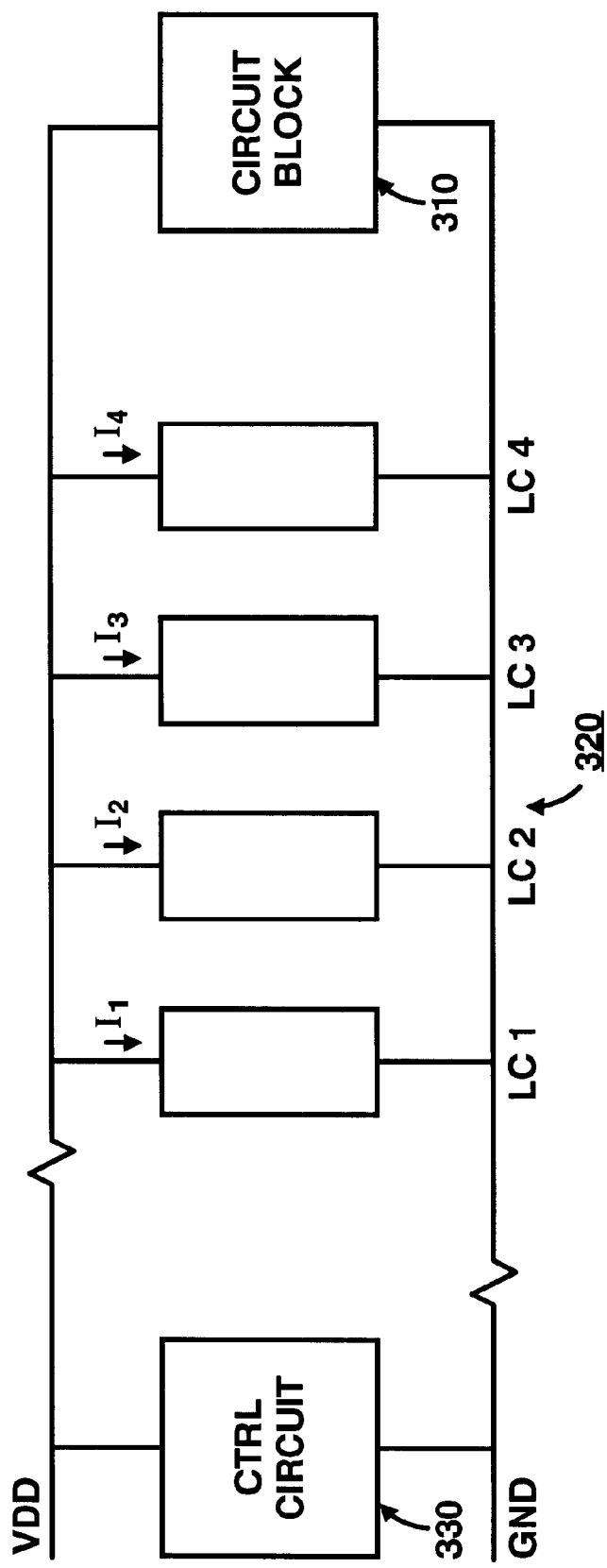
FIG. 3 illustrates an exemplary ramp loading circuit with a plurality of active loading elements and a control circuit for activating the ramp loading circuit.
Figure 3B:
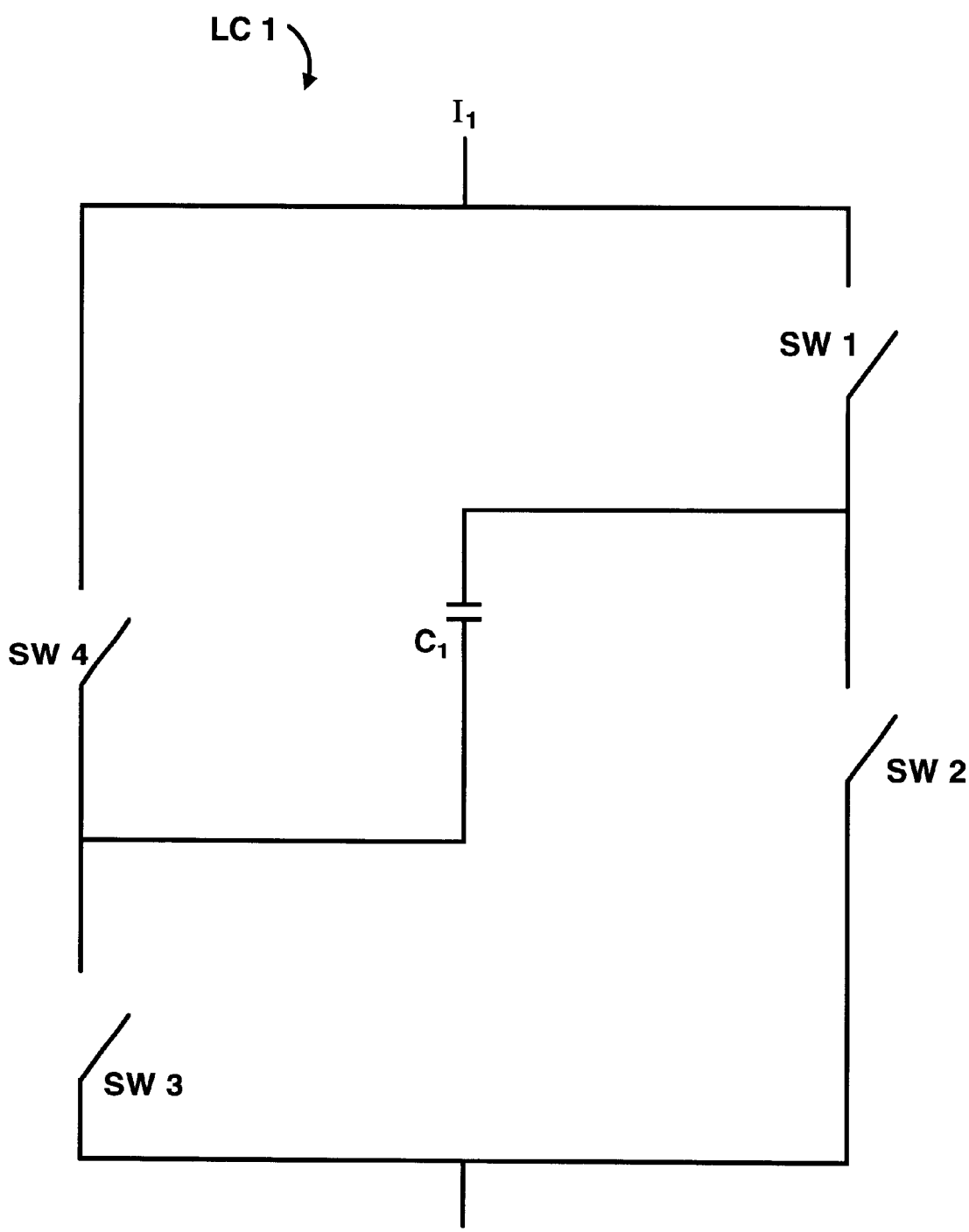

FIGS. 3A and 3B illustrate an exemplary embodiment of a ramp loading circuit 220 of FIG. 2. The ramp loading circuit of FIG. 3A (labeled as 320) includes a control circuit 330 and a plurality of load circuits LC1–LC4. Each of the load circuits LC1–LC4 may include active loads (or, impedance elements) $C_1$, as shown in FIG. 3B. For purely illustrative purposes, four such load circuits LC1–LC4 are shown.

As shown in FIG. 3B, each of the load circuit, such as, for example, LC1, may include an arrangement of switches SW1–SW4. The arrangement of switches may be manipulated by the control circuit 330 to control current through the circuit. The control circuit may turn "on" switches SW1 and SW3, with switches SW2 and SW4 "off," to allow current flow, $I_1$, through the load circuit LC1. The current through the circuit block will gradually increase until the capacitor $C_1$ is charged to $I_1$ or the steady state. The because the capacitor $C_1$ is fully charged, the current $I_1$ will be forced to flow through the circuit block 310. The control circuit 330 may turn switches SW1 and SW3 "off" when the steady state has been reached.

When the control circuit 330 wants to deactivate a load circuits LC1–LC4 of the ramp loading circuit 320, the control circuit may switch "on" switches SW2 and SW4 of the load circuit, while switches SW1 and SW3 are "off." Thus, the polarity of the terminals of the capacitor, for example, $C_1$, is reversed since the terminal previously coupled to $V_{DD}$ is now connected to GND and the terminal previously coupled to GND is now coupled to $V_{DD}$. This change in polarity allows the capacitor $C_1$, to discharge gradually from the steady state, for example, $I_1$ to zero. Discharge of the capacitor $C_1$ allows the current flow through the path LC1 to reverse, thereby decreasing the current flow through the circuit block 310.

Referring to FIG. 3A, the control circuit 330 may be programmed or designed to foresee a current surge and activate the multi-stage ramp shunting of the ramp loading circuit 320. Such ability to foresee a current surge is described in a concurrently filed patent application assigned to assignee of the present invention and entitled "Power Reduction Based On Ramp Up/Down Techniques With N Cycles Prediction", the entire subject of which is incorporated herein by reference.

Figure 4:
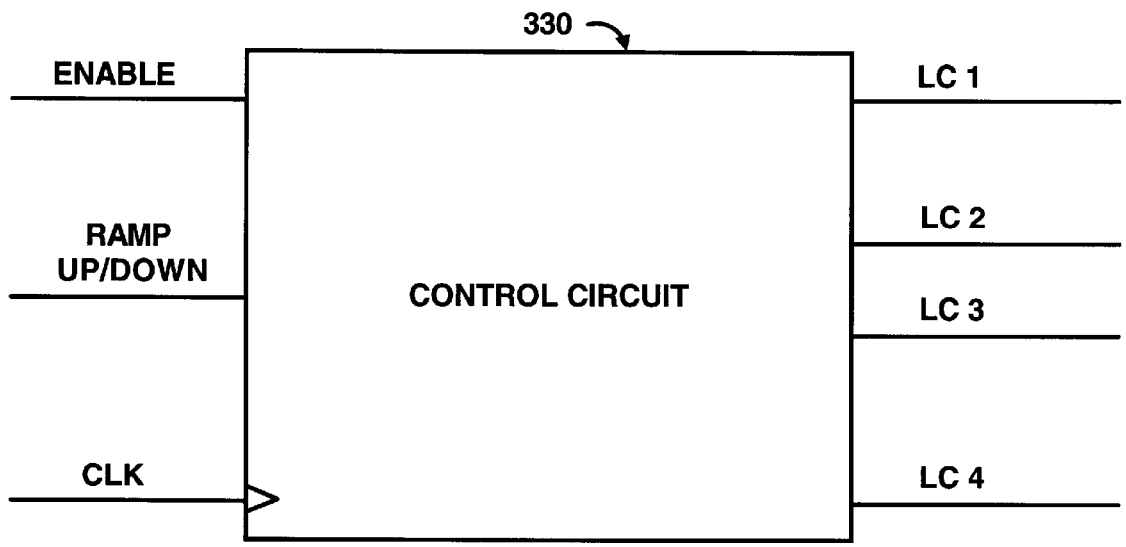
FIG. 4 illustrates an exemplary block diagram of a control circuit for controlling the ramp loading circuit according to an embodiment of the invention.

The control circuit 330, upon recognizing or foreseeing a current surge (or, the circuit block waking up from or going into a sleep mode), may manipulate the switches SW1–SW4 of the load circuit paths LC1–LC4 of FIG. 3 during a clock cycle of the control circuit of FIG. 4. This path (i.e., the LC1 path) includes a capacitive element $C_1$.

As shown in FIG. 4, the control circuit 330 includes a clock input, an enable port, and at least one ramp up/ramp down port. The enable port may be an input port used to turn the control circuit 330 on and off. In one embodiment, the ramp up and ramp down port will include separate ports. The ramp up and ramp down ports may each include more than one port. The ramp up and ramp down port may receive signals indicating to the control circuit the control circuit 330 should initiate a ramp up or ramp down. The control circuit 330 may be a typical control circuit, such as a combinational logic circuit implemented with transistors.

When a control circuit 330 predicts that the circuit block is waking up, the control circuit 330 may activate the ramp loading circuit 320. Activating the ramp loading circuit 320 may include closing each of the paths LC1–LC4. The control circuit may 330 close a path, for example, CL1 by turning "on" switches SW1 and SW3 of load circuit CL1 during a clock cycle.

As a result, an impedance is introduced or created and a path for current flow, for example, $I_1$ is created between the $V_{DD}$ and GND terminals through the LC1 path of the ramp loading circuit 320. The capacitor $C_1$ is charged to the value of $I_1$. Once the capacitor $C_1$ is fully charged, current cannot flow through the capacitor $C_1$. Therefore, the current $I_1$ is forced to flow through the circuit block 310. The circuit block 210 (of FIG. 2) may still be in a sleep (or, inactive/standby) mode during and after this clock cycle. At this time, there is no current flow through the LC2, LC3 and LC4 paths as they are all open.

During a next clock cycle, the LC2 path may be closed in addition to the LC1 path being closed. The LC2 path may be closed by turning on switches SW1 and SW3 of LC2. As a result, an additional impedance element $C_2$ is in parallel with $C_1$. This arrangement results in a decrease in the total impedance of the ramp loading circuit 320 and an increase in the current flow between terminal $V_{DD}$ and GND. With both LC1 and LC2 paths being closed, the current may be labeled as $I_2$.

Similarly, during a third clock cycle, LC3 path may be closed (in addition to LC1 and LC2) and a third impedance element $C_3$ is in parallel with $C_1$ and $C_2$. This results in a further decrease in the total impedance of the ramp loading circuit 320 and another increase in the current flow between $V_{DD}$ and GND that may be labeled as $I_3$.

Finally, in the illustrated example, during the next clock cycle, LC4 path may be closed and a fourth impedance element $C_4$ is in parallel with $C_1$, $C_2$ and $C_3$. Again, this results in a yet another decrease in the total impedance of the ramp loading circuit 320 and another increase in the current flow between $V_{DD}$ and GND that may be labeled as $I_4$. The above-described changes in the current flow are shown in Table 1.

TABLE 1

| SW1&SW3 | Cycle 0 | Cycle 1 | Cycle 2 | Cycle 3 | Cycle 4 | Cycle 5 |
|---|---|---|---|---|---|---|
| LC1 | Off | On | On | On | On | Off |
| LC2 | Off | Off | On | On | On | Off |
| LC3 | Off | Off | Off | On | On | Off |
| LC4 | Off | Off | Off | Off | On | Off |

Figure 1:
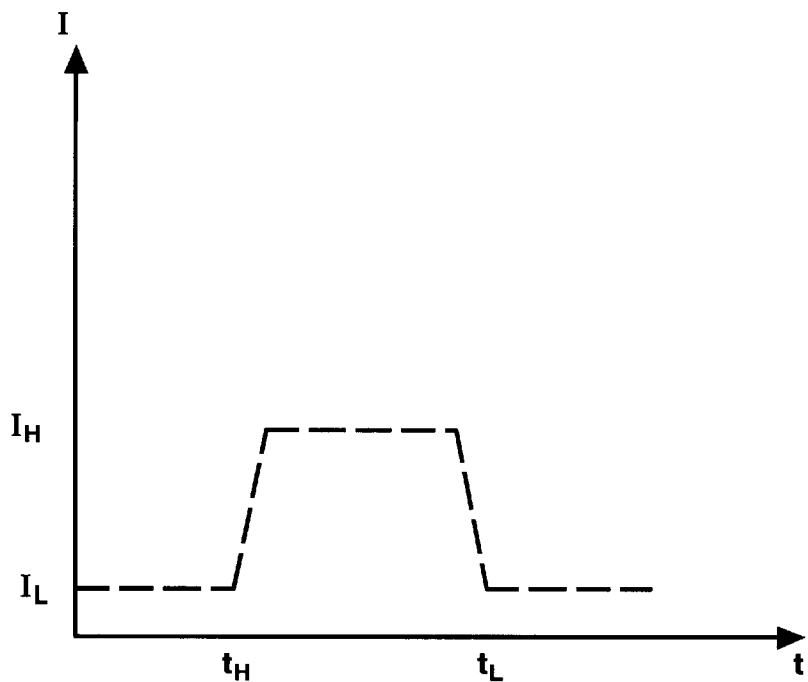
FIG. 1 illustrates current surge in a circuit block of an integrated circuit.
Figure 5:
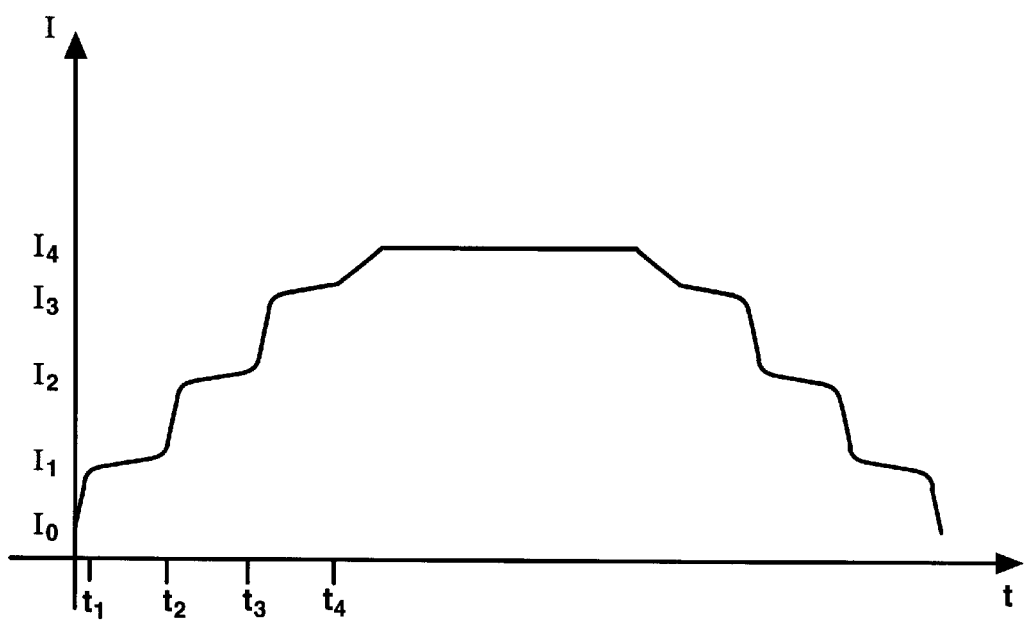
FIG. 5 illustrates a gradual ramping of current to a circuit block according to an embodiment of the invention.

The clock cycles may be programmed so that upon the current flow reaching the value of $I_4$ the circuit block 210 (of FIG. 2) reaches a wake-up or active state. Since the value of the current flow has increased in stages, the current flow between the terminals $V_{DD}$ and GND has a reached a maximum value without a surge. Therefore, noise resulting from such a current surge has been reduced or eliminated. The increase of the current flow in stages is illustrated in FIG. 5. This is in contrast to the current surge illustrated in FIG. 1.

While the invention has been described with reference to four active loading circuits or paths (or, impedance elements), it is not restricted to such a number. It may be greater or lesser than the number illustrated. Similarly, while successive clock cycles have been identified as closing the LC paths in FIG. 3, every other clock cycle may be used to achieve the result. Even fractions of a cycle, such as a half cycle, may also be used. A clock cycle may also be skipped;

that is, during the first clock cycle, LC1 path may be closed, during the second clock cycle, LC2 path may be closed and during the fourth cycle, LC3 path may be closed, etc.

The above described method is directed to a current increase (i.e., ramping up). A variation of this method may be used to address ramping down as well. The current flow, in this case, is decreasing. Therefore, the current flow is initially at a high value, such as $I_4$. When the control circuit 330 detects or receives indication that the circuit block 310 will be entering a sleep or dormant state, the control circuit 330 may deactivate the ramp loading circuit 320. Deactivating the ramp loading circuit 320 may include "opening" paths LC1–LC4 to decrease the current flow through circuit block 310 to $I_0$.

The control circuit 330 may open the paths LC1–LC4 in reverse order of their closing to gradually reduce the current through the circuit block 310. For example, the control circuit 330 may first open path LC4. The control circuit 330 may open path LC4 by turning "on" switches SW2 and SW4 of load circuit LC4.

As a result, since the polarity of the capacitor is reversed, a negative current flow $I_4$ is created between the $V_{DD}$ and GND terminals through the LC4 path of the ramp loading circuit 320. This reduces the current through the circuit block 310. The capacitor $C_1$ is discharged to the value of zero. The current through the circuit block 310 may be reduced to $I_3$ as a result of the discharging of capacitor $C_4$. The circuit block 210 (of FIG. 2) may still be in an active mode during and after this clock cycle.

During a next clock cycle, the LC3 path may be opened in addition to the LC4 path being opened. The LC3 path may be opened by turning on switches SW2 and SW4 of LC3. As a result, an additional impedance element $C_3$ is being discharged. This arrangement results in a decrease in the current flow between terminal $V_{DD}$ and GND. With both LC3 and LC4 paths being open, the current may be reduced to the $I_2$ level.

Similarly, during a third clock cycle, LC2 path may be opened (in addition to LC3 and LC4) and a third impedance element $C_3$ is discharged. This results in a further decrease in the total current flow between $V_{DD}$ and GND. The current flow through circuit block 310 may be reduced to the $I_1$ level with the LC2, LC3 and LC4 paths open.

Finally, in the illustrated example, during the next clock cycle, $LC_1$ path may be opened and a fourth impedance element $C_1$ is discharged. Again, this results in a yet another decrease in the total current flow between $V_{DD}$ and GND. This may reduce the total current through circuit block 310 to the $I_0$ level. The above-described changes in the current flow are shown in Table 2.

TABLE 2

| SW2&SW4 | Cycle 0 | Cycle 1 | Cycle 2 | Cycle 3 | Cycle 4 | Cycle 5 |
|---|---|---|---|---|---|---|
| LC1 | Off | Off | Off | Off | On | Off |
| LC2 | Off | Off | Off | On | On | Off |
| LC3 | Off | Off | On | On | On | Off |
| LC4 | Off | On | On | On | On | Off |

The clock cycles may be programmed so that upon the current flow reaching the value of $I_0$, the circuit block 210 (of FIG. 2) reaches a sleep or dormant state. Since the value of the current flow has decreased in stages, the current flow between the terminals $V_{DD}$ and GND has a reached a minimum value without a surge. Therefore, noise resulting from such a current surge has been reduced or eliminated.

The decrease of the current flow in stages is illustrated in FIG. 5. This is in contrast to the current surge illustrated in FIG. 1.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A ramp loading circuit for slowing current change in a circuit block, comprising:

a plurality of load circuits placed in parallel with a circuit block, each load circuit providing a path for current flow when the load circuit is activated and configured to allow gradual decrease in current flow through the circuit block when the load circuit is deactivated; and a control circuit configured to deactivate each load circuit before the circuit block enters the sleep mode.

2. The ramp loading circuit of claim 1, further comprising a detection circuit configured to detect when the circuit block is due to enter the sleep mode.

3. The ramp loading circuit of claim 1, wherein each load circuit comprises a capacitor coupled to a plurality of switches, the plurality of switches configured to discharge the capacitor by reversing its polarity when the control circuit deactivates the load circuit.

4. The ramp loading circuit of claim 1, wherein each of the plurality of switches comprises a field effect transistor.

5. The ramp loading circuit of claim 3, wherein the plurality of switches associated with each load circuit is configured to connect a first node of the capacitor to a first voltage node and a second node of the capacitor to a second voltage node when the load circuit is activated, and to connect the second node of the capacitor to the first voltage node and the first node to the second voltage node of the capacitor when the load circuit is deactivated.

6. The ramp loading circuit of claim 5, wherein the first voltage node comprises a high voltage node and the second voltage node comprises a low voltage node.

7. The ramp loading circuit of claim 1, wherein the control circuit is configured to activate each load circuit when the circuit block is predicted to wake up from the sleep mode.

8. The ramp loading circuit of claim 1, wherein the control circuit is configured to sequentially deactivate the load circuits.

9. The ramp loading circuit of claim 1, wherein the load circuits are activated by at least one of successive clock cycles and alternating clock cycles.

10. The ramp loading circuit of claim 1, wherein the load circuits are opened by fractional clock cycles.

11. The ramp loading circuit of claim 1 wherein the plurality of load circuits comprises four load circuits.

12. The ramp loading circuit of claim 1, wherein the circuit block comprises an integrated circuit.

13. A circuit comprising:

a first node;

a second node;

at least one circuit block connected between the first node and the second node; and a ramp loading circuit connected between the first and the second node, comprising:

a plurality of load circuits placed in parallel with the circuit block, each load circuit providing a path for current flow when the load circuit is activated and configured to allow gradual decrease in current flow through the path when the load circuit is deactivated; and a control circuit to deactivate each load circuit before the circuit block enters the sleep mode.

14. A method of reducing noise resulting from a current surge in a circuit, comprising:

detecting if a designated circuit is about to enter a sleep mode; and deactivating a plurality of load circuits providing a path for current flow in parallel with the designated circuit in response to detecting the designated circuit is about to enter the sleep mode, wherein the deactivation of each load circuit gradually reduces current flow through the path associated with the load circuit.

15. The method of claim 14, wherein deactivating each of the load circuits comprises discharging a capacitor associated with the load circuit.

16. The method of claim 14, wherein deactivating each of the load circuits comprises reversing the polarity of a capacitor to discharge the capacitor associated with the load circuit.

17. The method of claim 16, wherein reversing the polarity of the capacitor comprises manipulating an arrangement of switches coupled to the capacitor so that a positive terminal of the capacitor is coupled to a lower voltage node of the designated circuit and a negative terminal of the capacitor is coupled to a higher voltage node of the designated circuit.

18. The method of claim 14, further comprising predicting the designated circuit is waking up from a sleep mode, and activating each of the load circuits by manipulating the arrangement of switches to charge the capacitor associated with the load circuit.

19. The method of claim 14, wherein deactivating each of the load circuits comprises sequentially deactivating each of the load circuits.

20. The method of claim 14, wherein deactivating each of the load circuits comprises sequentially deactivating the load circuits by at least one of successive clock cycles and alternating clock cycles.

21. The method of claim 14, wherein deactivating each of the load circuits comprises deactivating each of the load circuits by fractional clock cycles.

* * * * *